US 6,746,896 B1

(12) United States Patent
Shi et al.

(10) Patent No.: US 6,746,896 B1
(45) Date of Patent: Jun. 8, 2004

(54) PROCESS AND MATERIAL FOR LOW-COST FLIP-CHIP SOLDER INTERCONNECT STRUCTURES

(75) Inventors: Song-Hua Shi, Phoenix, AZ (US); Ching-Ping Wong, Berkley Lake, GA (US)

(73) Assignee: Georgia Tech Research Corp., Atlanta, GA (US)

( * ) Notice: Subject to any disclaimer, the term of this patent is extended or adjusted under 35 U.S.C. 154(b) by 370 days.

(21) Appl. No.: 09/648,777

(22) Filed: Aug. 28, 2000

Related U.S. Application Data

(60) Provisional application No. 60/151,283, filed on Aug. 28, 1999.

(51) Int. Cl.⁷ .......................... H01L 21/44; H01L 21/48; H01L 21/50
(52) U.S. Cl. ........................ 438/108; 438/110; 438/113; 438/118
(58) Field of Search .................. 438/108–110, 113, 438/118, 330

(56) References Cited

U.S. PATENT DOCUMENTS 6,194,788 B1 * 2/2001 Gilleo et al.
6,207,475 B1 * 3/2001 Lin et al.

FOREIGN PATENT DOCUMENTS

JP 61-138614 * 6/1986

* cited by examiner

*Primary Examiner*—Ha Tran Nguyen
(74) *Attorney, Agent, or Firm*—Todd Deveau; Charles Vorndran; Thomas, Kayden, Horstemeyer & Risley LLP

(57) ABSTRACT

The present invention provides a novel process and its required fluxable materials for building low-cost flip-chip interconnect structures. The novel process involves two fluxable materials, fluxable wafer-level compressive-flow underfill material (WLCFU) and fluxable tacky film, and applies these two materials on a wafer level. The two materials can provide sufficient fluxing capability during solder reflow and significant improvement of the fatigue life of the formed solder interconnects after fully cured.

28 Claims, 6 Drawing Sheets

PROCESS AND MATERIAL FOR LOW-COST FLIP-CHIP SOLDER INTERCONNECT STRUCTURES

RELATED APPLICATIONS

This application claims priority from U.S. Provisional Patent Application Serial No. 60/151,283, filed Aug. 28, 1999.

FIELD OF THE INVENTION

This present invention is concerned with a novel process and its required materials in building low-cost flip-hip solder interconnect structures. The novel process involves two fluxable materials, fluxable wafer-level compressive-flow underfill material (WLCFLU) and fluxable tacky film, and applies these two materials on a wafer level. The two materials can provide sufficient fluxing capability during solder reflow and significant improvement of the fatigue life of the formed solder interconnects after fully cure. Therefore, this present invention provides a novel inexpensive surface mount technology (SMT) facility transparent process and polymeric materials suitable for underfilling processes in current industrial production of flip-chip solder interconnect structure for joining semiconductor devices to substrates that have improved fatigue life, and other applications where low-cost, high production efficiency, and high reliability are needed.

BACKGROUND OF THE INVENTION

The rapid advances of IC fabrication technology and the accelerated growth of the market for faster, smaller, yet less expensive products continue to pose challenges in IC packaging technology. As an ultimate solution for this trend, flip-chip technology on organic substrate has been invented, developed, and practiced for more than ten years. Underfill technology is one of the keys to the success of the low-cost flip-chip on organic board technology. The conventional underfill technology has relied on capillary flow and has been developed and practiced for some time. However, this conventional underfill technology needs separate flux dispensing, solder bump reflow, flux cleaning, underfill dispensing and flow, and off-line underfill curing steps. As such, the conventional underfilling process is tedious and expensive and not transparent to the SMT facilities. Recently, a more promising underfill technology called no-flow underfill technology has been invented and under development. The key to the success of the no-flow underfill technology lies in the availability of successful no-flow underfill materials. Currently available no-flow (compressive-flow) underfill materials can not include silica fillers since the addition of silica filler significantly reduces electrically conductive joint interconnection yield during reflow and underfill cure. As such, the cured no-flow underfill materials have higher CTE value (>70 ppm/° C.) and can not provide the desired enhancement of the joint fatigue life during reliability test, especially for larger chips and finer bump size. This has become the toughest technical barrier in developing and applying no-flow underfill technology. At the same time, the no-flow underfill technology still needs separate underfill dispensing step on an individual device and therefore can not fully take the advantages of the matured SMT technology and facility.

Our fundamental research further indicates the following mechanism that the addition of silica filler significantly reduces the solder interconnection yield. As shown in FIGS. 1(a) and (b), silica particles in the no-flow material are entrapped in-between the solder bumps and bond pads, such as copper bond pads, and therefore eliminates the opportunity for solder bumps to contact the bond pads during the entire reflow process. However, as shown in FIG. 1(c), once a solder bump is allowed to contact a bond pad during reflow process, the gravity and surface tension of solder melt can displace away the nearby silica filled underfill material and wet the bond pad. Therefore, a practical way to avoid this technical barrier is to guarantee the opportunity for every solder bump to contact its corresponding bond pad during reflow process.

The process presented in this patent is called wafer-level compressive-flow underfill (WLCFU) process and is intended to ensure satisfactory interconnection yield while exploiting silica filled no-flow underfill materials and making no-flow underfill technology totally SMT facility transparent. By using the materials describe herein, the process can guarantee the opportunity for every solder bumps to contact its corresponding bond pad during reflow process in using silica filled no-flow underfill materials.

SUMMARY OF THE INVENTION

The object of the invention is to provide a novel low-cost SMT facility transparent underfilling process by applying solvent-containing (coated at room temperature coating) or solvent-free fluxing WLCFU material (coated at elevated temperature at which the WLCFU material is melted) on an entire bumped wafer with controlled quantity so that the thickness of the solidified WLCFU layer is less than the bump height, solidifying the WLCFU material by solvent removal or simply cooling down, dicing the solid WLCFU material coated wafer into individual chips, covering the top of the bumps with a tacky film, mounting the WLCFU and tacky film coated individual chips to substrates, and reflowing the solder bumps and curing the WLCFU material and tacky film simultaneously. In some cases, post-cure of the WLCFU material and tacky film may be necessary to obtain full material properties of the WLCFU and tacky film.

The further objective of the invention is to provide an inexpensive fluxing epoxy based polymeric composition/formulation for WLCFU material application. The polymeric composition/formulation has curing peak temperature ranging from 160° C. to 350° C., which allows many reflow profiles for different solder bump materials with their melting point ranging from 150° C. to 350° C. Additionally, the cured composition/formulation has high enough (>60° C.) glass transition temperature (Tg), low enough coefficient of thermal expansion (CTE) (20–50 ppm/° C.), and excellent mechanical and physical properties.

Another further objective of the invention is to provide an inexpensive fluxing epoxy based polymeric composition/formulation for the tacky film application. The polymeric composition/formulation has curing peak temperature ranging from 160° C. to 350° C., which allows many reflow profiles for different solder bump materials with their melting point ranging from 150° C. to 350° C. Additionally, the cured composition/formulation has high enough (>125° C.) glass transition temperature (Tg), reasonable CTE (<80 ppm/° C., but prefer 20–40 ppm/° C.), and excellent mechanical and physical properties.

The advantages that the novel underfilling process (WLCFU process) has over other underfilling process are as follows: (1) Higher underfilling efficiency is obtained since the underfill material is applied on an entire bumped-wafer instead of each individual chip. (2) The process is SMT facility transparent since the fluxing WLCFU material and tacky film has been already applied on chips and no underfill dispensing machine is needed. (3) High interconnection yield is guaranteed since the fluxing tacky film provides the opportunity for each solder bump to contact its corresponding bond pad during solder bump reflow. (4) High reliability is obtained since the WLCFU material is loaded with silica filler and therefore has desired low CTE value.

The solvent-containing or solvent-free WLCFU material can be solidified by solvent removal or simply cooling down. The WLCFU material is composed of some or all of the following components: (a) a cycloaliphatic epoxy resin, a bisphenol A epoxy resin, a bisphenol F epoxy resin, an epoxy novolac resin, a biphenyl epoxy resin, a naphthalene epoxy resin, a dicyclopentadiene-phenol epoxy resin, a reactive epoxy diluent, and the mixture thereof; (b) an organic curing hardener selected from the group consisting of aromatic amimes, carboxylic acid anhydride, imidazole and its derivatives, and phenolic resins; (c) a latent curing catalyst selected from the group consisting of tertiary amines, tertiary phosphines, imidazole and its derivatives, imidazolium salts, metal chelates, oniumm salts, quaternary phosphonium compounds, 1,8-diazacyclo[5.4.0]undex-7-ene, and the mixture thereof; (d) a fluxing agent selected from the group consisting of any chemicals containing hydroxyl (—OH) group or carboxylic (—COOH) group or both, such as glycerin, ethylene glycol, tartaric acid, adipic acid, citric acid, malic acid, and glutaric acid; (e) spherical silica filler with diameter ranging from 0.1 $\mu$m to 50 $\mu$m; (f) a solvent selected from the group consisting of the organic chemicals whose boiling point ranges from 25° C. to 200° C. and do-not react-with any other components in the WLCFU composition/formulation, such as 4-methyl-2-pentanone; (g) an adhesion promoter selected from the group consisting of silane coupling agents, titanates, and zirconates; and, (h) a surfactant selected from the group consisting of non-ionic surfactants, such as polyethylene glycols.

The fluxable tacky film material is solvent free and dispensable at room temperature. The tacky film material is composed of some or all of the following components: (a) a cycloaliphatic epoxy resin, a bisphenol A epoxy resin, a bisphenol F epoxy resin, an epoxy novolac resin, a biphenyl epoxy resin, a naphthalene epoxy resin, a dicyclopentadiene-phenol epoxy resin, a reactive epoxy diluent, and the mixture thereof; (b) an organic curing hardener selected from the group consisting of aromatic amines, carboxylic acid anhydride, imidazole and its derivatives, and phenolic resins; (c) a latent curing catalyst selected from the group consisting of tertiary amirnes, tertiary phosphines, imidazole and its derivatives, imidazolium salts, metal chelates, oniumm salts, quaternary phosphonium compounds, 1,8-diazacyclo[5.4.0]undex-7-ene, and the mixture thereof; (d) a fluxing agent selected from the group consisting of any chemicals containing hydroxyl (—OH) group or carboxylic (—COOH) group or both, such as glycerin, ethylene glycol, tartaric acid, adipic acid, citric acid, malic acid, and glutaric acid; (e) an adhesion promoter selected from the group consisting of silane coupling agents, titanates, and zirconates; and, (f) a surfactant is selected from the group consisting of non-ionic surfactants, such as polyethylene glycols.

BRIEF DESCRIPTION OF THE FIGURES

The construction and design to carry out the invention will hereinafter be described together with other features thereof. The invention will be more readily understood from a reading of the following specification and by reference to the accompanying drawings forming a part thereof, wherein.

DETAILED DESCRIPTION OF THE PREFERRED EMBODIMENT

The present invention may be understood more readily by reference to the following detailed description of preferred embodiments of the invention.

The term "alkyl" as used herein refers to a branched or unbranched saturated hydrocarbon group of 1 to 24 carbon atoms, such as methyl ("Me"), ethyl ("Et"), n-propyl, isopropyl, n-butyl, isobutyl, t-butyl, octyl, decyl, and the like. Preferred alkyl groups herein contain from 1 to 12 carbon atoms.

By the term "effective amount" of a compound, product, or composition as provided herein is meant a sufficient amount of the compound, product or composition to provide the desired results. As will be pointed out below, the exact amount required will vary from substrate to substrate, depending on the particular compound, product or composition used, its mode of administration, and the like. Thus, it is not always possible to specify an exact "effective amount." However, an appropriate effective amount may be determined by one of ordinary skill in the art using only routine experimentation.

As used herein, the term "suitable" is used to refer to a moiety which is compatible with the compounds, products, or compositions as provided herein for the stated purpose. Suitability for the stated purpose may be determined by one of ordinary skill in the art using only routine experimentation.

As used herein, "substituted" is used to refer, generally, to a carbon or suitable heteroatom having a hydrogen or other atom removed and replaced with a further moiety. Moreover, it is intended that "substituted" refer to substitutions which do not change the basic and novel utility of the underlying compounds, products or compositions of the present invention.

Figure 1:
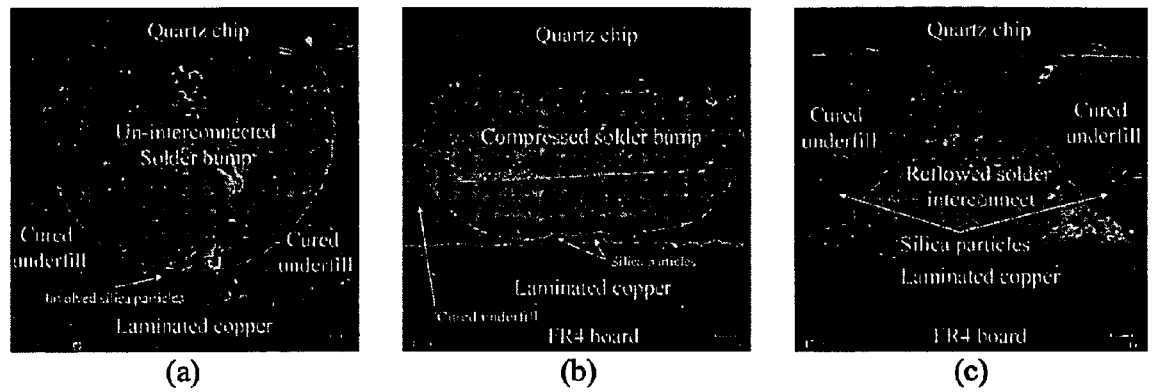
FIGS. 1(a)–(c) are a micrograph showing the appearance of solder bumps after reflow using filled no-flow underfill material.
Figure 2:
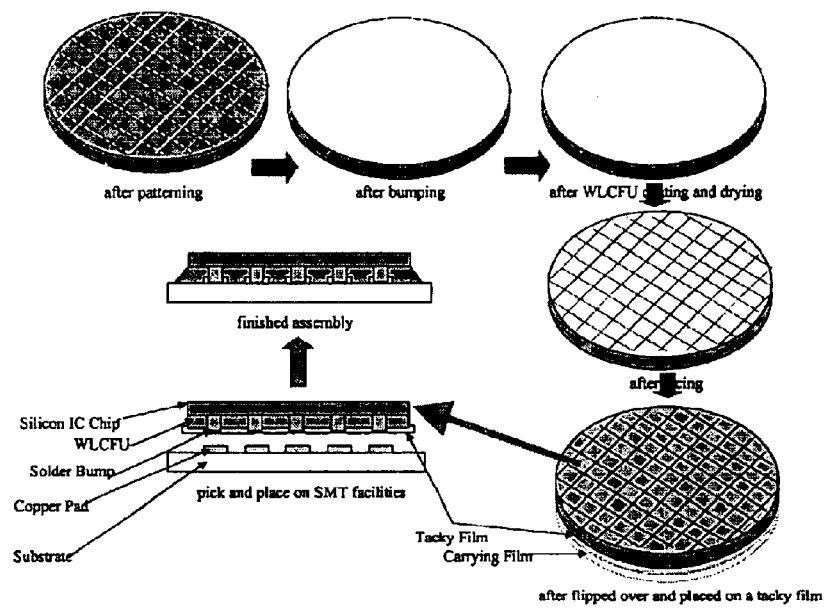
FIG. 2 is a schematic representation of the steps of an flip-chip solder interconnet process in accordance with the present invention.

FIG. 2 schematically shows the wafer-level compressive-flow underfill process of the present invention. In this process, a patterned silica wafer 100 is bumped at step. AA to produce a bumped wafer 110. Next at step BB, the bumped wafer 110 is coated with a layer of the WLFCU material and the coating is allowed to dry to produce a WLCFU material coated wafer 120. Fluxable liquid silica filled or un-filled WLCFU has a proper viscosity and is uniformly dispensed on an entire bumped wafer 110 using screen printing, spinning coating, curtain coating, meniscus coating, and etc. Then, the WLCFU material is solidified with enough adhesion strength to bumped wafer 110. The thickness of the solid WLCFU material is~10 µm less than the bump height so that the tip of solder bumps are not covered by the solid WLCFU material.

Next, at step CC the entire solid WLCFU material coated wafer is diced (singulated) into individual chips without damaging the coated WLCFU layer to produce a diced wafer 130. The diced-wafer 140 is then flipped over and placed on a thin layer of fluxable tacky film that is on a carrying film at step DD to produce a flipped wafer 140. The adhesion strength of the fluxable tacky film to the carrying film is designed to be less than to the solid WLCFU layer so that the fluxable tacky film can stick to the WLCFU layer in the later pick-and-place process. After the individual chip is picked, aligned, and placed on a circuit board or substrate at steps EE and FF, the fluxable tacky film can hold the chip to the circuit board and maintain the alignment With the increase of the temperature during reflow process, the solid WLCFU material is melted and the viscosity of both WLCFU material and fluxable tacky film becomes very low. The chip is then compressed down by its own gravity. Since the tacky film guarantees no silica particles in-between the solder bumps and bond pads, every solder bump has the opportunity to contact its corresponding bond pad and finally realize the satisfactory interconnection yield. After curing, the cured tacky film layer is very thin. Therefore, only the WLCFU material acts as the cured silica filled conventional underfill material to enhance the thermo-mechanical fatigue life of the formed solder joints.

Solid epoxy resins are particularly useful in WLCFU material and tacky film applications for easier handling and wafer dicing. The solid epoxy resins include solid bisphenol A epoxy resins, epoxy novolac resins, biphenyl epoxy resins, naphthalene epoxy resins, and dicyclopentadiene-phenol epoxy resins. Besides the solid epoxy resins, liquid epoxy resins are also used to control the viscosity of the developed WLCFU material for satisfactory interconnection yield and assembly processing. The liquid epoxy resins include cycloaliphatic epoxy resins, liquid bisphenol A epoxy resins, bisphenol F epoxy resins, and reactive epoxy diluent. The selection of epoxy resin mixture affects the WLCFU-process-required viscosity. For WLCFU material, its viscosity must be changed abruptly during heating. At room temperature, the WLCFU material must be solid or tacky-free. But the WLCFU material needs to be re-melted at a temperature below 100° C., and its viscosity drastically reduces with further temperature increase, and its low viscosity should maintain until solder reflow. For tacky films, it should have similar properties with the WLCFU material by be tacky at room temperature.

Solid or liquid epoxy hardeners are specifically selected to meet the WLCFU process-required curing characteristics (curing latency) and processability. Phenolic resins are specifically useful since they can provide excellent adhesion, lower CTE, low mositure uptake, and controllable curing characteristics. Aromatic amines, carboxylic acid anhydrides, and imidazole and its derivatives are sometimes used since they can provide WLCFU-process-required curing characteristic.

WLCFU process requires that the qualified WLCFU material and tacky film must have high curing latency. That is, minimal curing takes place before solder reflow and rapid curing occurs just after the solder reflow. Therefore, the selection of the latent catalyst can have a strong influence on the properties of underfill materials. These latent catalyst can be selected from the group of tertiary amines, tertiary phosphines, imidazole and its derivatives, imidazolium salts, metal chelates, oniumm salts, quaternary phosphonium compounds, 1,8-diazacyclo[5.4.0]undex-7-ene, and any mixture thereof.

Since WLCFU process reflows the solder joint and cure the WLCFU material and tacky film material at the same time, proper selection of fluxing agent is one of the key parameters in designing a successful WLCFU material and tacky film material. The employed fluxing agent should be able to remove the metal oxide and prevent the solder melt from reoxidation during the high temperature curing of a no-flow underfill formulation. At the same time, the fluxing agents should not cause noticeable negative effects on the curing profile and final properties of the no-flow underfill materials. The selection of fluxing agent also depends on the other components in the WLCFU material and tacky film material. From these requirements, the qualified fluxing agent for the WLCFU material and tacky film material is narrowed to the group consisting of any chemicals containing hydroxyl (—OH) group or carboxylic (—COOH) group or both, such as glycerin, ethylene glycol, tartaric acid, adipic acid, citric acid, malic acid, and glutaric acid.

Coupling agents (also called adhesion promoters) are another component in designing a successful no-flow underfill material. Coupling agents are used mainly to improve the adhesion between the chip to underfill material and between the underfill material to the substrate. Any type of silane coupling agent, mercaptan compound, organo-titanate, organo-zirconate, organo-aluminate, aluminum chelate, and xircoaluminate can be used in a no-flow underfill materials. The preferred silane coupling agents used in the invention include amine, epoxy, mercapto, styryl and chloroalkyl type silane coupling agents. The preferred organo-titanates and organo-zirconates used in the invention include neopentyl (diallyl)oxy tri(N-ethylenedianineo) ethyl titanate, neopentyl (diallyl)oxy tri(m-amino)phenyl titanate, neophetyl (diallyl)oxy tri(dioctyl) phosphato titanate, and neopentyl (diallyl)oxy tri(dioctyl) pyrophosphato zirconate.

Using a surfactant in a no-flow underfill material is another way to prevent the process voiding during the flip-chip bonding and subsequent solder joint reflow and material curing. The surfactant used in the WLCFU material and tacky film material preferably is non-ionic to eliminate the corrosive possibility. The surfactant that can be used in these material systems is narrowed down to silicones, polyoxyethylene/polyoxypropylene block copolymers, ethylene diamine based polyoxyethylene/polyoxypropylene block copolymers, polyol-based polyoxyalkylenes, fatty alcohol-based polyoxyalkylenes, and fatty alcohol polyoxyalkylene alkyl ethers.

Filler may be used in WLCFU material to reduce CTE and improve other desired properties such as thermal conductivity for higher flip-chip reliability. The morphology, size, and size distribution of filler affects the viscosity of the WLCFU material and other mechanical properties. Besides, the filler used in WLCFU material should be inert. Fillers that can meet the requirement for WLCFU material application include fused silica, more preferably spherical fused silica, silicone nitride, silver particle, more preferably silver flake, and gold particle, more preferably gold flake. Preferably, the filler has a particle diameter ranging from 0.1 $\mu$m to 50 $\mu$m.

The epoxy resin mixture may be prepared by adding solid and liquid epoxy resins until the epoxy mixture is tacky-free at room temperature but can be re-melted with viscosity lower than 1 Pa.S at a temperature below solder reflow temperature. The added amount of hardener in the WLCFU material and tacky film material are 0.5 to 1.5 equivalent of total epoxy rings in the formulation.

An acceptable ratio at which the accelerator can be used is 0.01 to 20 parts in 100 parts of the mixture of epoxy resin mixture and hardener.

The fluxing agents may be added at a ratio of 0.1 to 20 parts, by weight, to 100 parts of the mixture of the epoxy resin mixture and organic carboxylic acid anhydride hardeners.

The coupling agent, or surfactant may be added at a ratio of 0.01 to 10 parts, by weight, to 100 parts mixture of epoxy resin mixture and organic carboxylic acid anhydride hardeners.

The ratio of the added filler in WLCFU material may range from 0 wt % to 80 wt % of the total weight of the mixture of epoxy mixture and hardener.

The following, non-limiting examples, are presented to further illustrate the present invention.

EXAMPLE 1

Solvent-containing WLCFU Material

A formulation contains 37.5 g solid bisphenol A epoxy resin with its molecular weight of 1075g/mol, 12.5 g biphenyl epoxy resin (2,2'-[(3,3'5,5'-tetramethyl[1,1'-biphenyl]-4,4'-diyl)bis(oxymethylene)]bis oxirane), 12.5 g novolac resin, 0.075 g tetraphenylphosphonium tetraphenylborate, 50 g spherical silica filler with average diameter of 7 $\mu$m, 1.5 g citric acid, and 50 g 4-methyl-2-pentanone. The formulation is suitable for solvent-containing WLCFU material application.

EXAMPLE 2

Solvent-Free WLCFU Material

A formulation contains 8 g solid bisphenol A epoxy resin with its epoxy equivalent value 187 g/eqv., 12 g biphenyl epoxy resin (2,2'-[(3,3'5,5'-tetramethyl[1,1'-biphenyl]-4,4'-diyl) bis oxyrnethylene)] bis oxirane), 10.8 g novolac resin, 0.1 g 1,8-diazacyclo[5.4.0]undex-7-ene, 0.5 g glutaric acid, 1 g epoxy diluent Heloxy M48, and 30.8 g spherical fused silica filler with average diameter of 7 $\mu$m. The formulation is suitable for solvent-free WLCFU material application.

EXAMPLE 3

Tacky Film Sample

A formulation contains 10 g bisphenol A epoxy resin EPON 8281 with its molecular weight of 374 g/mol, 8.77 g naphthalene epoxy resin EXA-4700 from Dainippon Chemicals, 14.37 g hexahydro-4-methyl phthalic anhydride, 0.01 g tetraphenylphosphonium tetraphenylborate, and 1.0 g glycerin. The formulation is suitable for the tacky film application.

Example 4

A 250 ml three neck round-bottom flack, equipped with a mechanical stirrer and refluxing condenser, was charged with 100 grams of solid epoxy mixture, 30 grams of solid novolac resin hardener, and 50 grams of ketone solvent. With stirring, the flask was then heated to the refluxing temperature of the ketone and kept at this temperature until all the solid epoxy resin mixture and hardener were dissolved. Then, the flask was cooled down to 60° C. 0.3 wt % curing catalyst to the epoxyahardener mixture was added to the flask under stirring until the dissolution of the curing catalyst. Then 3.0 wt % liquid fluxing agent to the epoxy-hardener mixture was added to the flask and stirred for about 5 minutes to assure its uniform dispersion. If necessary, a specified quantity of silica filler was added to the prepared mixture and stirred for another half an hour so that the silica filler was uniformly dispersed in the material system. Only un-filled material was evaluated. The prepared WLCFU material was placed in a capped bottle and stored in –40° C. freezer.

Property Characterizations

Drying Kinetics: The frozen WLCFU material was warmed to room temperature at first. About 30 mg of the material was put in a TGA sample pan and uniformly coated on the inside bottom of the TGA sample pan. The thickness of the coated material layer is about 200 $\mu$m. Under nitrogen gas purging (12 ml/min. horizontal purging and 77 ml/min. vertical purging), the sample pan was quickly heated to a selected temperature and kept at this temperature for 5 hours. The weight loss versus time was automatically recorded and used for drying kinetics analyses. Then the sample was heated to 225° C. at a heating rate of 10° C./min. The weight loss during this process was considered as the outgassing of the material during reflow process.

Curing Kinetics To study the curing of the prepared WLCFU material, a modulated DSC instrument (by TA Instruments, Model 2920) was used. The WLCFU material was coated on an aluminum foil and dried in a ~100° C. convection oven for 3 hours. A ~10 mg dried WLCFU material was placed into a hermetic DSC sample pan. The sample pan was then heated in the DSC cell at 5° C./min to around 280° C. to obtain the curing profile.

CTE and TMA Tg: Measurement of CTE and TMA Tg of a cured WLCFU material was performed on a TMA instrument (by TA Instruments, Model 2940). A specimen for TMA testing was prepared by placing a dried material into an aluminum pan (37.5 mm diameter), then the pan was transferred to an 80° C. preheated convective oven, and then heated to the temperature 170° C. at a heating rate of 5° C./min and isothermally cured at 170° C. for 30 minutes. Then, the sample was heated to 240° C. at a heating rate of ~5° C./min. and isothermally cured at this temperature for 30 minutes. The sample was then removed from the oven and cooled down to room temperature. A diamond saw was used to cut the cured sample into strips with dimensions of about 5×5×2 mm. After placing a specimen in the TMA instrument, heat was applied from room temperature to about 250° C. at a rate of 5° C./min. The thermal coefficient of linear expansion (CTE) was obtained from the thermal expansion quantity vs. temperature. The CTE value obtained from the temperature range of 45–90° C. (below Tg) is defined as $\alpha_1$ CTE while that obtained from the temperature range higher than Tg is defined as CTE $\alpha_2$. The inflection point of thermal expansion was defined as TMA Tg.

Storage Modulus and Cross-linking Density: The preparation of a specimen used for DMA testing is the same as that for the TMA specimen. The experiments were performed on a DMA instrument (by TA Instruments, Model 2980). However, the dimension of the specimens for DMA test is longer and wider, about 32×11×3 mm. The measurement was performed on a single cantilever mode under 1 Hz sinusoidal strain loading. Storage modulus (E') and loss tangent (tan δ) were calculated by the pre-installed software. The peak temperature of tan δ was defined as the DMA Tg. The cross-linking density is calculated from the equation (1). where E' is the storage modulus of the cured samples at the temperature 40° C. higher than peak temperature of tan δ, $\phi=1$ is a front factor (assumed to be $\phi=1$), R is the gas constant, and T is the absolute temperature. The assumption behind this calculation is that the cured epoxy resin is in fully rubbery state at that temperature.

Viscosity Study: A rheometer (by TA Instruments, Model AR1000 -N) was used to investigate the viscosity change during a specifically designed heating process that simulates the typical reflow profile of eutectic Sn/Pb solder bump. The dried WLCFU material was first melted on the bottom parallel plate at 100° C. The upper parallel plate was then lowered down to compress the material melt into a layer with a specific thickness. The two parallel plates were cooled down to 90° C. and then heated to 230° C., using the pre-described heating process.

Fluxing Capability Test: A bumped quartz chip and organic solder preservative (OSP) coated copper board was used in this test. The bumps are area-array distributed and the height and diameter of the bumps is 3 mil and 3 mil, respectively. The liquid WLCFU was manually coated on the bump side of the chip and dried in a convection oven at 100° C. for 3 hours. The quartz chip was then flipped over and put on the OSP coated copper board. The test vehicle then went through a SMT five-zone reflow oven. The voiding and solder wetting on the copper board were examined by an optical microscope.

Material Properties Characterization

Based on the proposed wafer level compressive-flow underfill process, the tacky material should be able to provide the similar properties as a no-flow underfill material. Therefore, a B-stage no-flow underfill technology was used to develop this tacky material. The characterized material properties of the developed tacky material were listed in Table 1.

TABLE 1

The Characterized Material Properties of the Tacky Material

| | |
|---|---|
| Outgassing during reflow | minimal |
| Curing peak temperature @ 5° C./min. heating rate | 174.2° C. |
| Gel temperature under the reflow profile in FIG. 2 | >200° C. |
| Fully cure condition | 60 minutes @ 170° C. |
| CTE ($\alpha_1$ @ 45° C.–90° C.) | 67.8 ppm/° C. |
| TMA Tg | 152.6° C. |
| Storage modulus @ 30° C. | 2.57 Gpa |
| Cross-linking density | 2.30 × 10$^{-3}$ mole/cm$^3$ |

TABLE 1-continued

The Characterized Material Properties of the Tacky Material

| | |
|---|---|
| Moisture absorption | 1.04 wt % |
| Fluxing capability | Good |

Figure 3:
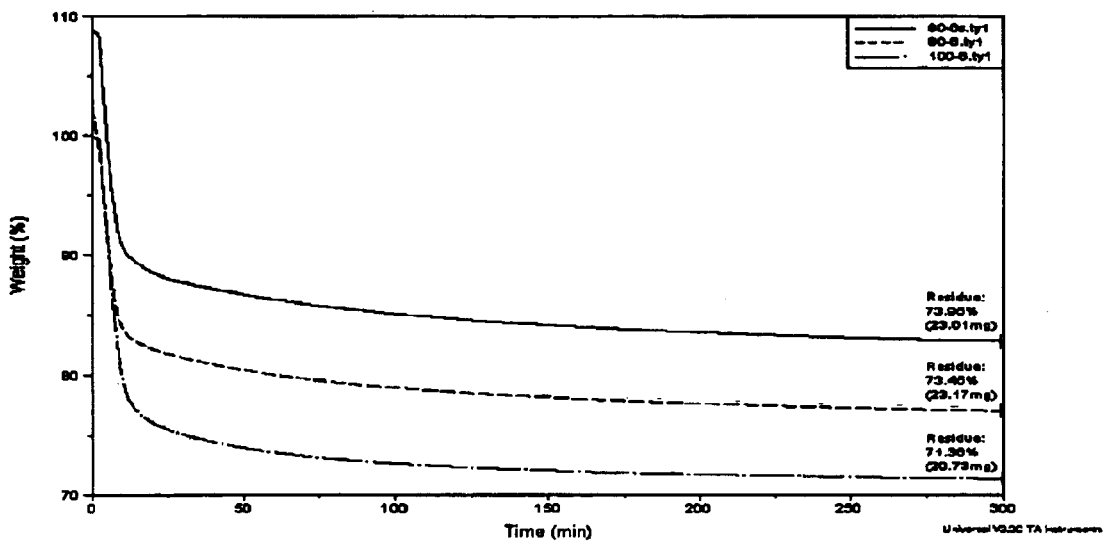
FIG. 3 is a graph of the weight loss versus time during an isothermal drying process in accordance with the present invention at 80° C., 90° C., and 100° C., respectively.
Figure 4:
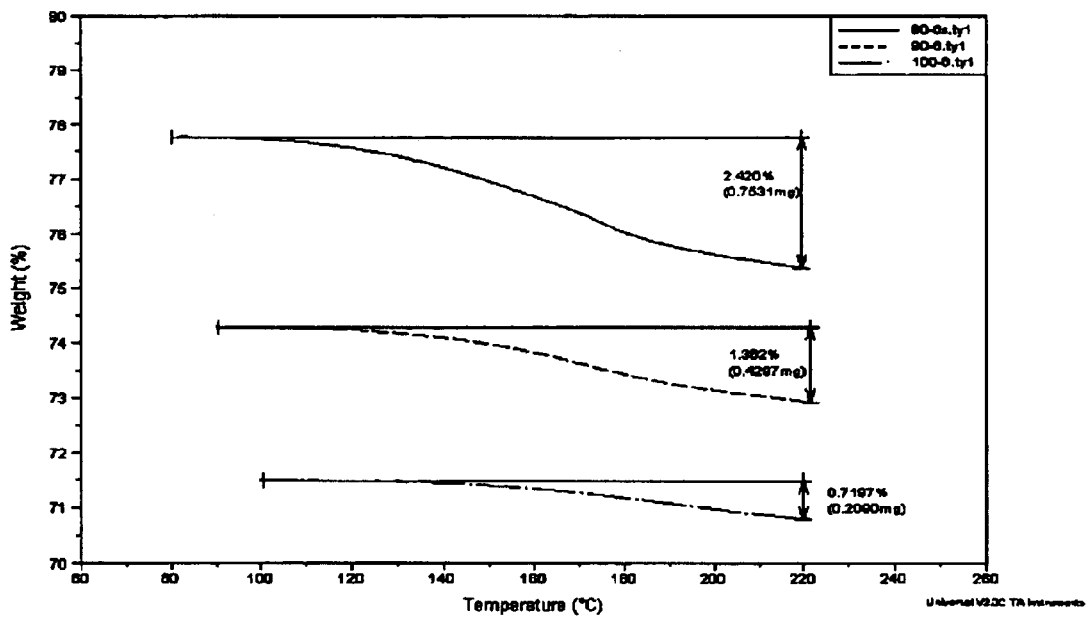
FIG. 4 is a graph of the weight loss during reflow during a process for producing WLCFU materials in accordance with the present invention after 5 hours drying at 80° C., 90° C., and 100° C., respectively.

FIG. 3 shows the drying kinetics of the WLCFU material at drying temperature 80° C., 90° C., and 100° C., respectively. It was found that the vaporization of the solvent in liquid WLCFU material mainly occurs in the first one hour for all the studied temperatures. After 5 hours isothermal drying, the residue weight percentage for 80° C., 90° C., and 100° C. drying processes: are 73.95%, 73.45%, and 71.36%, respectively. Considering that the non-vaporizing components in the WLCFU formulation is 72.68%, the experimental results indicated that there are still about 1.3% and 0.8% solvent residue in the dried material after 5 hours 80° C. and 90° C. drying, respectively. However, 5 hours' 100° C. drying can completely vaporize the solvent. Reflow testing also supported this analysis. The WLCFU material from 5 hours' 80° C. drying process showed voiding during reflow process, but the materials from 5 hours' 90° C. and 100° C. dying process did not show any voiding. FIG. 4 shows the weight loss during the heating process from the drying temperature to 220° C., which was designed to investigate the possible outgassing during the reflow process. For the WLCFU material dried at 80° C., 90° C., and 100° C. for 5 hours, the weight loss during reflow process is 2.42%, 1.36%, and 0.72%, respectively. The higher weight loss for the materials from the 80° C. and 90° C. drying process was due to the solvent residue. The weight loss for material from the 100° C. drying process was due to the minor vaporization of other components at so high temperature.

Figure 5:
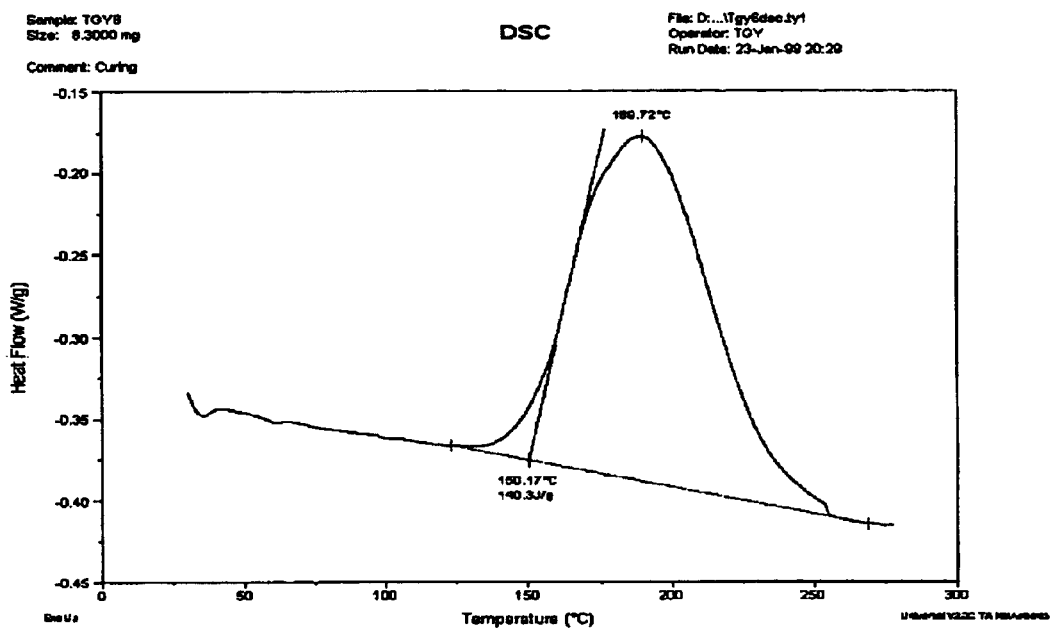
FIG. 5 is a graph of the DSC measured curing profile of dried WLCFU material prepared in accordance with the present invention.
Figure 6:
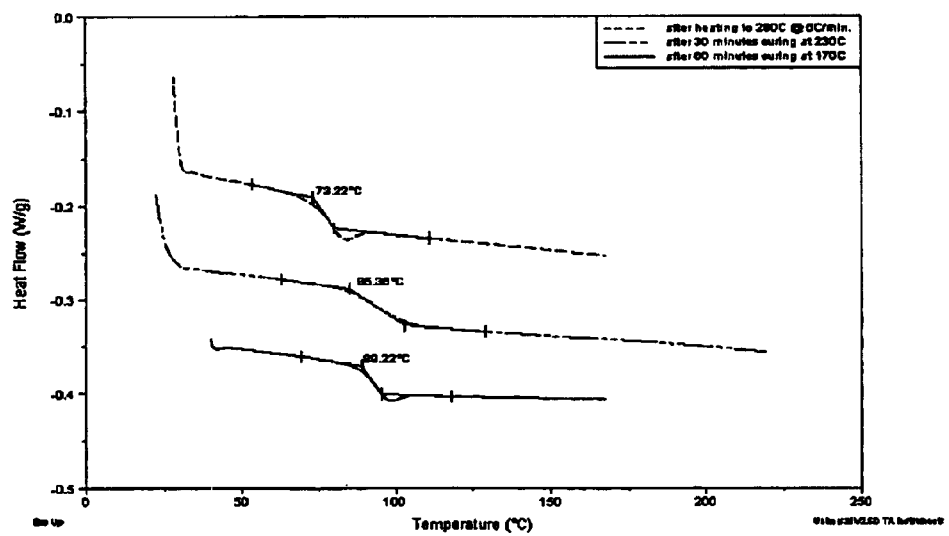
FIG. 6 is a graphical comparison of DSC measured Tg of the cured WLCFU material under three different curing conditions in accordance with the present invention.

To provide the dried WLCFU material with desired processability requirements, the selection of the curing catalyst is of critical importance. The dried WLCFU material needs to be easily re-melted and keep low viscosity before solder reflow, and be on-line or off-line fully cured after solder reflow. FIG. 5 shows the curing profile of the dried WLCFU material. The curing onset temperature and peak temperature is 125° C. and 189.7° C., respectively. This slow curing WLCFU material, on one hand, always keeps low viscosity through the typical reflow profile of eutectic Sn/Pb bumps as shown in FIG. 11(b). This assures the formation of good solder interconnects during reflow process. On the other hand, DSC study indicated that this WLCFU material can be fully cured within one hour at the temperature of 170° C., which is 13° C. lower than the melting point of eutectic Sn/Pb material and therefore safe for the formed solder interconnects. The supporting experimental results are shown in FIG. 6. Considering the fact that the WLCFU material after 30 minutes cure at 230° C. has been verified to be completely cured, the DSC measured Tg's indicated that the developed WLCFU material can be fully cured at 170° C. for 60 minutes but can not be fully cured by heating to 280° C. at 5° C./min. This is because the developed slow curing material preferred the longer curing at lower temperature rather than shorter curing at higher temperature.

Figure 7:
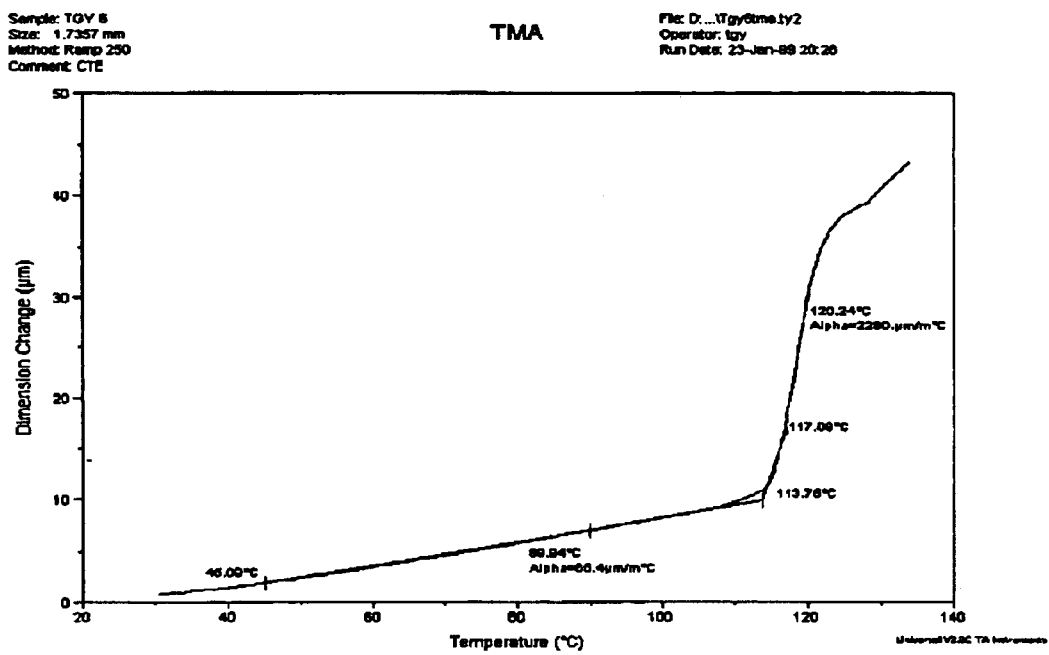
FIG. 7 is a graph of the TMA measured CTE and heat distortion temperature (TMA Tg) of a cured WLCFU material prepared in accordance with the present invention.
Figure 8:
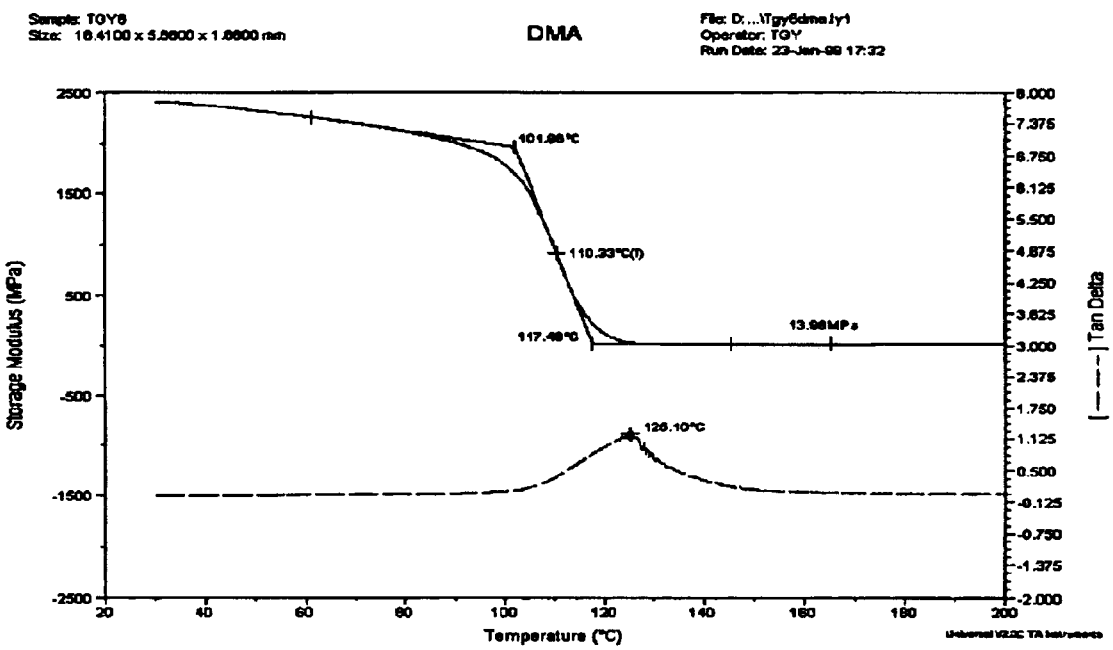
FIG. 8 is a graph of the DMA measured storage modulus and Tan($\delta$) of a cured WLCFU material prepared in accordance with the present invention.
Figure 9:
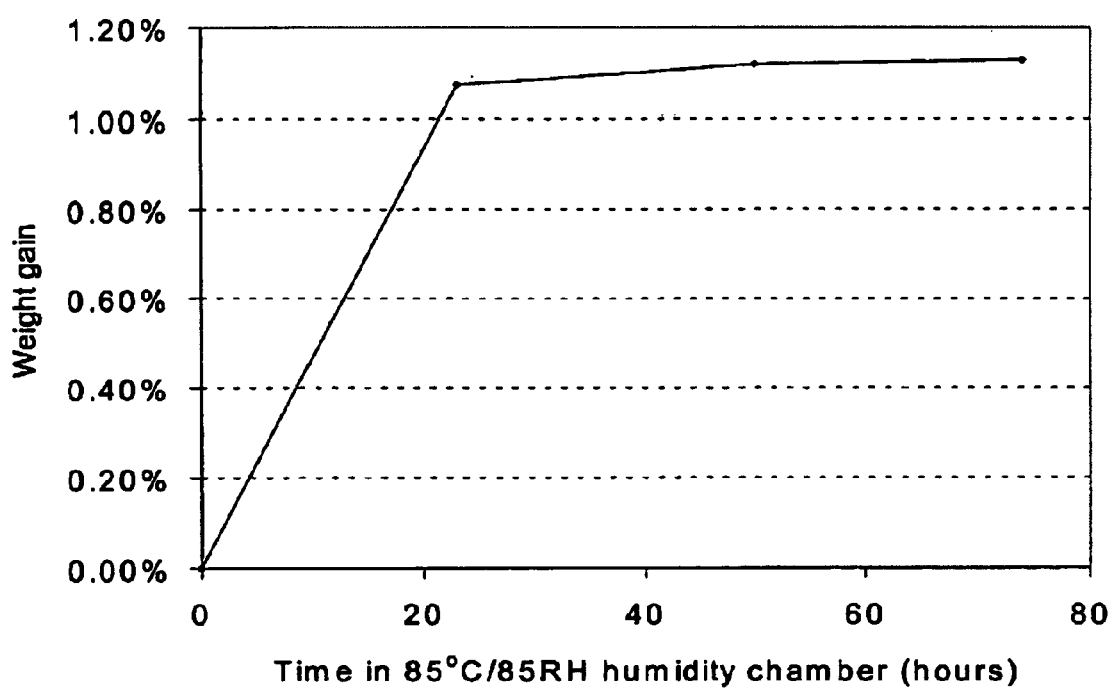
FIG. 9 is a graph of the weight gain of a cured WLCFU material prepared in accordance with the present invention versus exposure time at 85° C./85 in a humidity chamber.

FIGS. 7 through 9 show the CTE ($\alpha_1$), TMA Tg, storage modulus, cross-linking density, and moisture absorption of the cured WLCFU material. They are 65.4 ppm/° C., 113.75° C., 2.4 GPa, 1.28×10$^3$ mol/Cm$^3$, and 1.1 wt %, respectively.

Figure 10:
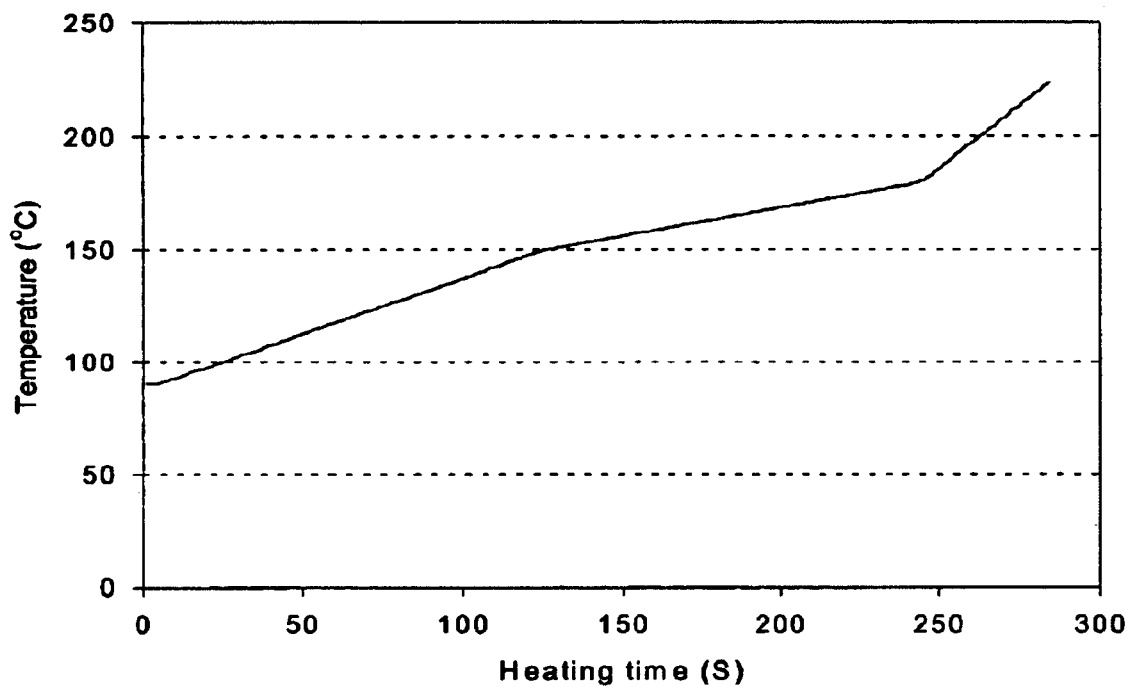
FIG. 10 is a graph of the heating profile of the rheometer for the simulation of the pre-described reflow profile in accordance with the present invention.
Figure 11:
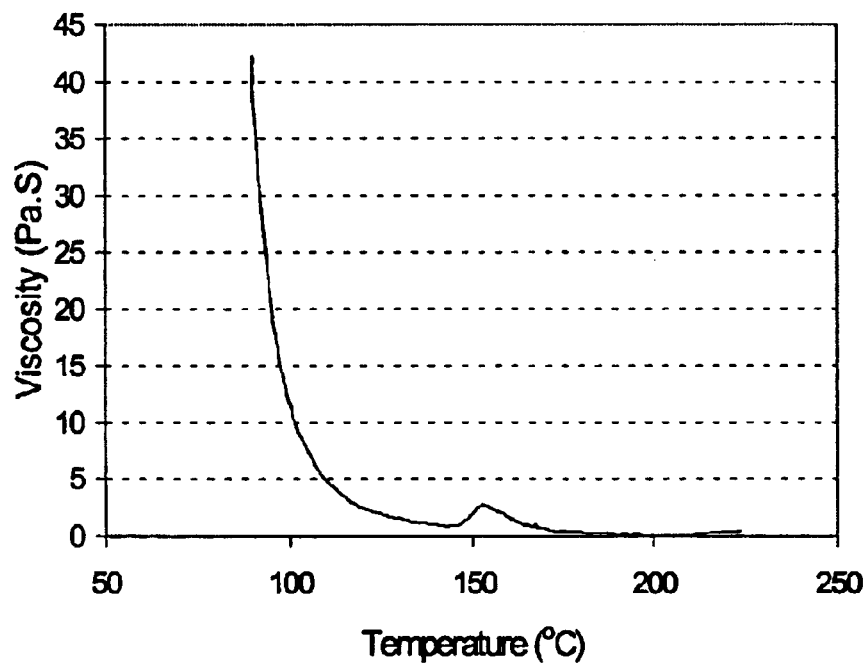
FIG. 11 is a graph of the viscosity change of a dried WLCFU material prepared in accordance with the present invention under the heating profile described in FIG. 10.

FIGS. 10 and 11 show the heating profile and the viscosity change of the dried WLCFU material under this heating profile. The dried WLCFU material was a non-tacky solid material, which could be remelted at the temperature below 80° C. After the material was melted, its viscosity dropped very quickly with the increase of temperature. In the temperature region between 150° C. to 180° C., the viscosity ranges from 0.82Pa.S to 0.35Pa.S, which assures the good flow of the material so that the chip can compress down by its own gravity and the material can fill into anywhere in-between the chip and substrate.

Processability Test

This test was performed on quartz chip with area-array distributed eutectic Sn/Pb bumps and an OSP protected copper laminated FR4 board. The liquid WLCFU coated patterned side of the quartz chip was examined before drying. The bumps were all covered by the WLCFU material. There were no entrapped air bubbles in the WLCFU material layer and contact interfaces with WLCFU material. The surface of the coated WLCFU material was smooth. These observations indicated the suitable rheology of the liquid WLCFU material. After drying, there were also no air bubbles and the surface of the WLCFU layer was still smooth. But the thickness of the WLCFU layer was slightly lower than the height of the bumps due to the vaporization of the solvent. A very thin layer of tacky material was applied on to the dried WLCFU layer and then the chip was placed on an OSP protected copper laminated FR4 board with the tacky side of the chip touching the copper side of the board so that the chip can be held on the board. After treatment in the five-zone SMT reflow oven the solder bumps wet the copper layer and collapse due to the lack of solder mask. This indicated the enough fluxing capability of the WLCFU material. Microscopic observation found several voids within the WLCFU material layer. These voids appear due to the entrapped air when the chip compressed down during the reflow process The SEM cross-section view of reflowed bump was examined and the bump was found to have spread so well during reflow process that all the solder melt actually connected each other. Since the bumps have collapsed, their stand-off height is so low that the CTE mismatch between cured WLCFU material and solder material has already cracked the WLCFU-solder interface.

The characterized properties of the developed WLCFU material were tabulated in Table 2. The preliminary processability test indicated that the developed WLCFU material could provide sufficient fluxing capability and meet other basic requirements of the wafer level compressive flow underfilling process.

TABLE 2

The Characterized Material Properties of WLCFU Material

| | |
|---|---|
| Coating | pass |
| Drying | 3 hours @ 100° C., or 5 hours @ 90° C. |
| Outgassing during reflow | <0.8% |
| Curing onset temperature | 125° C. |
| Curing peak temperature | 189.7° C. |
| CTE ($\alpha_1$ @ 45° C.–90° C.) | 65.4 ppm/° C. |
| TMA Tg | 113.7° C. |
| Storage modulus @ 30° C. | 2.4 GPa |
| Cross-linking density | $1.28 \times 10^{-3}$ mole/cm$^3$ |
| Fluxing capability | Good |

It, thus, will be appreciated that the objects of this invention have been fully and effectively accomplished. It will be realized, however, that the foregoing preferred specific embodiment has been shown and described for the purpose of this invention and is subject to change without departure from such principles. Therefore, this invention includes all modifications encompassed within the spirit and scope of the following claims.

What is claimed is:

1. A wafer-level compressive-flow underfilling (WLCFU) process comprising the steps of:
   applying a WLCFU material onto a surface of a bumped wafer in an amount sufficient to ensure that the thickness of the solidified WLCFU layer is less than the height of the wafer bumps;
   solidifying the WLCFU material;
   separating the WLCFU material coated wafer into individual chips;
   covering the top of the bumps with a tacky film for promoting solder interconnects without intervening WLCFU material, wherein the tacky film and the WLCFU,material are not the same;
   mounting the WLCFU material and tacky film coated individual chips to substrates; and
   reflowing the solder bumps and curing the WLCFU material and tacky film simultaneously.

2. The wafer-level compressive-flow underfilling (WLCFU) process of claim 1, wherein said WLCFU material is a solvent-containing WLCFU material and said solidifying step includes the step of solidifying said WLCFU material by solvent removal.

3. The wafer-level compressive-flow underfilling (WLCFU) process of claim 1, wherein said WLCFU material is a solvent-free fluxing WLCFU material and said WLCFU solidifying step includes the step of solidifying said WLCFU material by cooling.

4. The wafer-level compressive-flow underfilling (WLCFU) process of claim 1, further comprising a post-curing step.

5. The wafer-level compressive-flow underfilling (WLCFU) process of claim 1, wherein said WLCFU material comprises:
   a. an epoxy resin;
   b. an organic curing hardener;
   c. a latent curing catalyst;
   d. a fluxing agent; and
   e. a filler.

6. The wafer-level compressive-flow underfilling (WLCFU) process of claim 5, wherein said epoxy resin is selected from the group consisting of: a cycloaliphatic epoxy resin, a bisphenol A epoxy resin, a bisphenol F epoxy resin, an epoxy novolac resin, a biphenyl epoxy resin, a naphthalene epoxy resin, a dicyclopentadiene-phenol epoxy resin, a reactive epoxy diluent, and any mixture thereof.

7. The wafer-level compressive-flow underfilling (WLCFU) process of claim 5, wherein said organic curing hardener is selected from the group consisting of: a phenolic resins, an aromatic amine, a carboxylic acid anhydride, an imidazole, and an imidazole derivative.

8. The wafer-level compressive-flow underfilling (WLCFU) process of claim 5, wherein said curing catalyst is selected from the group consisting of: a tertiary amine, a tertiary phosphine, an imidazole, an imidazole derivative, an imidazolium salt, a metal chelate, an onium salt, a quaternary phosphonium compound, 1,8-diazacyclo[5.4.0]undex-7-ene, and any mixture thereof.

9. The wafer-level compressive-flow underfilling (WLCFU) process of claim 5, wherein said fluxing agent comprises a compound containing a hydroxyl (—CH) group.

10. The wafer-level compressive-flow underfilling (WLCFU) process of claim 5, wherein said fluxing agent comprises a compound containing a carboxylic (—COOH) group.

11. The wafer-level compressive-flow underfilling (WLCFU) process of claim 5, wherein said filler is selected from the group consisting of: a spherical fused silica filler, a silicon nitride filler, a silver flake filler, and a gold flake filler with diameters ranging from 0.1 μm to 50 μm.

12. The wafer-level compressive-flow underfilling (WLCFU) process of claim 5, wherein said WLCFU material further comprises a solvent.

13. The wafer-level compressive-flow underfilling (WLCFU) process of claim 12, wherein said solvent is an organic chemical having a boiling point between 25° C. to 200° C. which does not react with any other components in the WLCFU composition/formulation.

14. The wafer-level compressive-flow underfilling (WLCFU) process of claim 12, wherein said solvent is 4-methyl-2-pentanone.

15. The wafer-level compressive-flow underfilling (WLCFU) process of claim 5, wherein said WLCFU material further comprises an adhesion promoter.

16. The wafer-level compressive-flow underfilling (WLCFU) process of claim 15, wherein said adhesion promoter is selected from the group consisting of: a silane coupling agent, a titanate, and a zirconate.

17. The wafer-level compressive-flow underfilling (WLCFU) process of claim 5, wherein said WLCFU material further comprises a surfactant.

18. The wafer-level compressive-flow underfilling (WLCFU) process of claim 17, wherein said surfactant is a non-ionic surfactant.

19. The wafer-level compressive-flow underfilling (WLCFU) process of claim 1, wherein said tacky film comprises:
   a. an epoxy resin;
   b. an organic curing hardener;
   c. a latent curing catalyst; and
   d. a fluxing agent.

20. The wafer-level compressive-flow underfilling (WLCFU) process of claim 19, wherein said tacky film is selected from the group consisting of: a cycloaliphatic epoxy resin, a bisphenol A epoxy resin, a bisphenol F epoxy resin, an epoxy novolac resin, a biphenyl epoxy resin, a naphthalene epoxy resin, a dicyclopentadiene-phenol epoxy resin, a reactive epoxy diluent, and any mixture thereof.

21. The wafer-level compressive-flow underfilling (WLCFU) process of claim 19, wherein said organic curing hardener is selected from the group consisting of a phenolic resin, an aromatic amine, a carboxylic acid anhydride, an imidazole, and an imidazole derivative.

22. The wafer-level compressive-flow underfilling (WLCFU) process of claim 19, wherein said latent curing catalyst is selected from the group consisting of: a tertiary amine, a tertiary phosphine, an imidazole, an imidazole derivative, an imidazolium salt, a metal chelate, an onium salts, a quaternary phosphonium compounds, 1,8-diazacyclo [5.4.0]undex-7-ene, and any mixture thereof.

23. The wafer-level compressive-flow underfilling (WLCFU) process of claim 19, wherein said fluxing agent comprises a compound containing a hydroxyl (—OH) group.

24. The wafer-level compressive-flow underfilling (WLCFU) process of claim 19, wherein said fluxing agent comprises a compound containing a carboxylic (—COOH) group.

25. The wafer-level compressive-flow underfilling (WLCFU) process of claim 19, wherein said tacky film further comprises an adhesion promoter.

26. The wafer-level compressive-flow underfilling (WLCFU) process of claim 25, wherein said adhesion promoter is selected from the group consisting of: a silane coupling agent, a titanates, and a zirconate.

27. The wafer-level compressive-flow underfilling (WLCFU) process of claim 19, wherein said tacky film further comprises a surfactant.

28. The wafer-level compressive-flow underfilling (WLCFU) process of claim 27, wherein said surfactant is a non-ionic surfactant.

* * * * *